United States Patent [19]
Tang et al.

[11] Patent Number: 6,021,909
[45] Date of Patent: Feb. 8, 2000

[54] EQUIPMENT ENCLOSURE RACK SUPPORT RAIL SYSTEM

[75] Inventors: Kenneth K. Tang, Sacremento; Henry Jupille, Placerville, both of Calif.

[73] Assignee: Hewlett-Packard Company, Palo Alto, Calif.

[21] Appl. No.: 09/191,963

[22] Filed: Nov. 13, 1998

[51] Int. Cl.[7] .......................................... A47F 5/00
[52] U.S. Cl. .............................. 211/183; 211/26; 211/190; 312/265.1; 312/265.4; 361/829
[58] Field of Search ............................... 211/189, 26, 183, 211/187, 190; 312/265.1, 265.4, 265.5, 265.6; 361/829, 726, 724, 683

[56] References Cited

U.S. PATENT DOCUMENTS

| | | | |
|---|---|---|---|
| 5,165,770 | 11/1992 | Hahn | 211/26 X |
| 5,546,277 | 8/1996 | Zandbergen | 361/726 |
| 5,571,256 | 11/1996 | Good et al. | 211/26 |
| 5,791,498 | 8/1998 | Mills | 211/26 |
| 5,807,008 | 9/1998 | Schwenk et al. | 312/265.1 X |
| 5,897,180 | 4/1999 | Singer | 312/265.3 |

*Primary Examiner*—Robert W. Gibson, Jr.

[57] ABSTRACT

An equipment enclosure rack support rail system comprising an elongated support rail including an elongated side portion adapted to mount directly to the rack and an elongated base portion adapted to directly support an equipment component, and further comprising a low profile tie-down clamp that is securely mountable to the support rail to secure the equipment component supported by the support rail. The support rail of the system is further provided with a pair of upper alignment tabs and a pair of lower alignment tabs that extend rearwardly from the side portion of the support rail. One upper alignment tab and one lower alignment tab are positioned at each end of the support rail, and are vertically spaced a fraction of an EIA-U from each other such that the lower alignment tabs can be used to mount the rail in a whole EIA-U position and the upper alignment tabs can be used to mount the rail and equipment component in a fractional EIA-U position.

16 Claims, 7 Drawing Sheets

EQUIPMENT ENCLOSURE RACK SUPPORT RAIL SYSTEM

FIELD OF THE INVENTION

The invention relates generally to an equipment enclosure rack support rail system. More particularly, the invention relates to an equipment enclosure rack support rail system that permits whole and fractional EIA-U positioning and which permits online field replacement of equipment component modules.

BACKGROUND OF THE INVENTION

Typically, computer and data storage equipment is housed in standardized equipment enclosures. These equipment enclosures normally comprise an outer, aesthetically pleasing housing which is supported by an inner rack. The rack usually comprises a substantially rectilinear metal frame including several vertical columns each provided with a plurality of mounting and alignment holes which permit the mounting of various equipment hardware to the rack.

The individual equipment components to be mounted inside the equipment enclosure typically are supported by support rails that mount to the columns of the rack. Normally, these rails are screwed or bolted to the rack and the equipment components each placed atop one set of rails. To hold the components in place, the components similarly bolt to the columns of the rack. To further secure the components, usually rear securement clamps are mounted to the rails in abutment to the equipment components to prevent shifting, especially during shipping.

As is known in the art, the support rails typically include alignment tabs adapted to fit within the alignment holes of the rack. Together, the alignment tabs and holes facilitate quick installation of the rails and equipment components by ensuring alignment between the mounting holes provided on the support rails and those provided on the columns of the rack. In conventional systems, the alignment holes are spaced in whole Electronic Industries Association units (EIA-U). The EIA-U is a standardized unit of length equal to 44.45 millimeters. In that conventional support rails are provided with only one set of alignment tabs, the rails can only be attached to the rack in whole EIA-U positions along the rack.

Recently, there have been increased efforts in the industry to maximize equipment storage density in equipment enclosure systems by reducing wasted space with the enclosures. In addition, there has been an effort to provide for online field replacement of equipment component modules such that inoperative or malfunctioning modules can be quickly removed from the rear of the enclosure and replaced without shutting down the system (known in the art as "hot swapping"). The conventional enclosure rack support rail systems described above impede both of these goals.

With regard to storage density, conventional systems prevent maximum utilization of equipment enclosure space because several of the equipment components produced today have non-whole EIA-U dimensions. This creates wasted space within the enclosure in that fractional EIA-U spaces often are left unoccupied. For instance, if a first equipment component is 3.5 EIA-U in height and a second equipment component is 2.0 EIA-U in height, a 0.5 EIA-U of space is wasted if the second component is mounted above the first because the support rails for the second component cannot be mounted to the rack directly adjacent the first component. It can be appreciated that further 0.5 EIA-U spaces are wasted when other whole and non-whole EIA-U height components are installed within the same enclosure. In addition to creating unoccupied areas, these spaces further permit the equipment purchaser to see the unaesthetic rack mounting hardware. Although this hardware can be hidden with front filler panels, this mandates the manufacture and supply of additional parts for the enclosure system.

To remedy these problems, provision of separate whole and half EIA-U support rails has been proposed. Although adequately solving the spacing problem described above, this solution presents the disadvantage of increasing the complexity of planning and ordering enclosed equipment systems and further increases the number of mounting kits that must be stocked by the manufacturer. In another solution, adjustable support rails having elongated adjustment slots have been proposed. Although allowing for fractional EIA-U mounting, these systems present the disadvantages of increasing manufacturing costs and complicating the installation process.

Regarding the hot swapping objective, many conventional systems prevent equipment component modules from being quickly removed and replaced in that rail side flanges typically are required to retain conventional rear securement clamps. These return flanges intrude inwardly into the horizontal equipment envelope of the enclosure to prevent the individual equipment component modules from being removed. Accordingly, the entire component must be removed from the front of the enclosure before the module can be replaced, requiring system shut-off therefore resulting in system down-time.

From the above, it can be appreciated that it would be desirable to have an equipment enclosure rack support rail system which solves the above-identified problems.

SUMMARY OF THE INVENTION

The present invention relates to a rack support rail system for use in an equipment enclosure including a rack to which equipment components are to be mounted. The support rail system comprises an elongated support rail including an elongated side portion adapted to mount directly to the rack and an elongated base portion adapted to directly support an equipment component. The side portion is substantially planar and has a top edge, first and second ends which form first and second outer edges, and a plurality of mounting holes provided therein. The base portion similarly is substantially planar and has an outer edge and first and second ends.

The system further includes a tie-down clamp that is securely mountable to the support rail to secure the equipment component supported by the support rail. The tie-down clamp is configured to have a low profile so as not to intrude substantially into the horizontal equipment envelope within the equipment enclosure such that individual equipment component modules can be removed from the rear of the enclosure without the need to remove the entire equipment component.

The support rail of the system is further provided with alignment means for aligning the elongated support rail with the enclosure rack in either whole or fractional EIA-U positions so that the equipment storage density can be maximized within the enclosure. Normally, these means comprise a pair of upper alignment tabs and a pair of lower alignment tabs that extend rearwardly from the side portion of the support rail. One upper alignment tab and one lower alignment tab are positioned at each end of the support rail, and are vertically spaced a fraction of an EIA-U such that the support rail can be mounted to the rack in whole and fractional EIA-U positions. Arranged in this manner, the enclosure rack support rail system of the present invention provides for both simple equipment installation in whole or fractional EIA-U positions and online field replacement of equipment component modules.

The particular objects, features, and advantages of this invention will become more apparent upon reading the following specification, when taken in conjunction with the accompanying drawings. It is intended that all such additional features and advantages be included therein with the scope of the present invention, as defined by the claims.

BRIEF DESCRIPTION OF THE DRAWINGS

The invention can be better understood with reference to the following drawings. The components in the drawings are not necessarily to scale, emphasis instead being placed upon clearly illustrating the principles of the present invention. In the drawings, like reference numerals designate corresponding parts throughout the several views.

DETAILED DESCRIPTION

Figure 1:
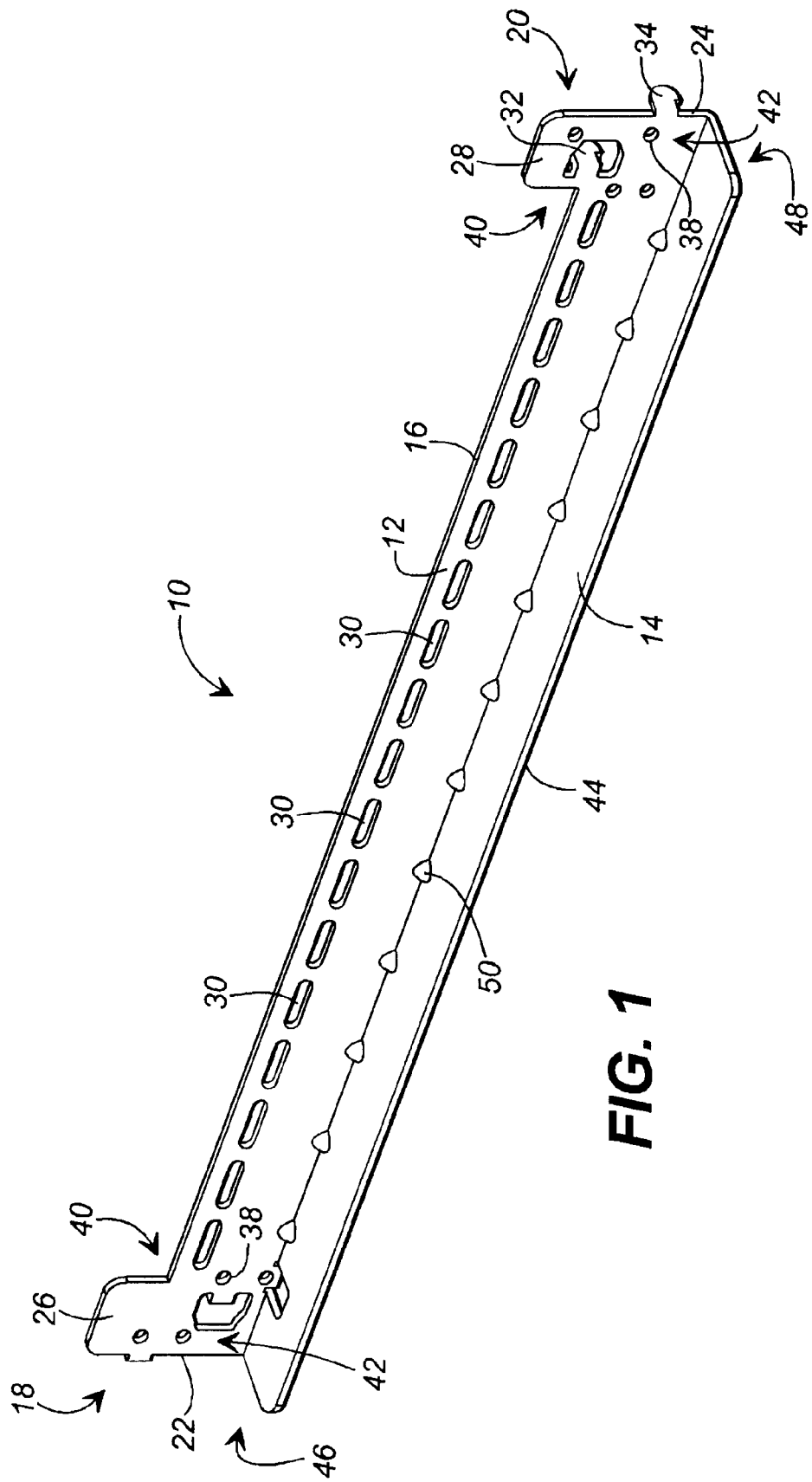
FIG. 1 is a upper front perspective view of a support rail constructed in accordance with the present invention.
Figure 2:
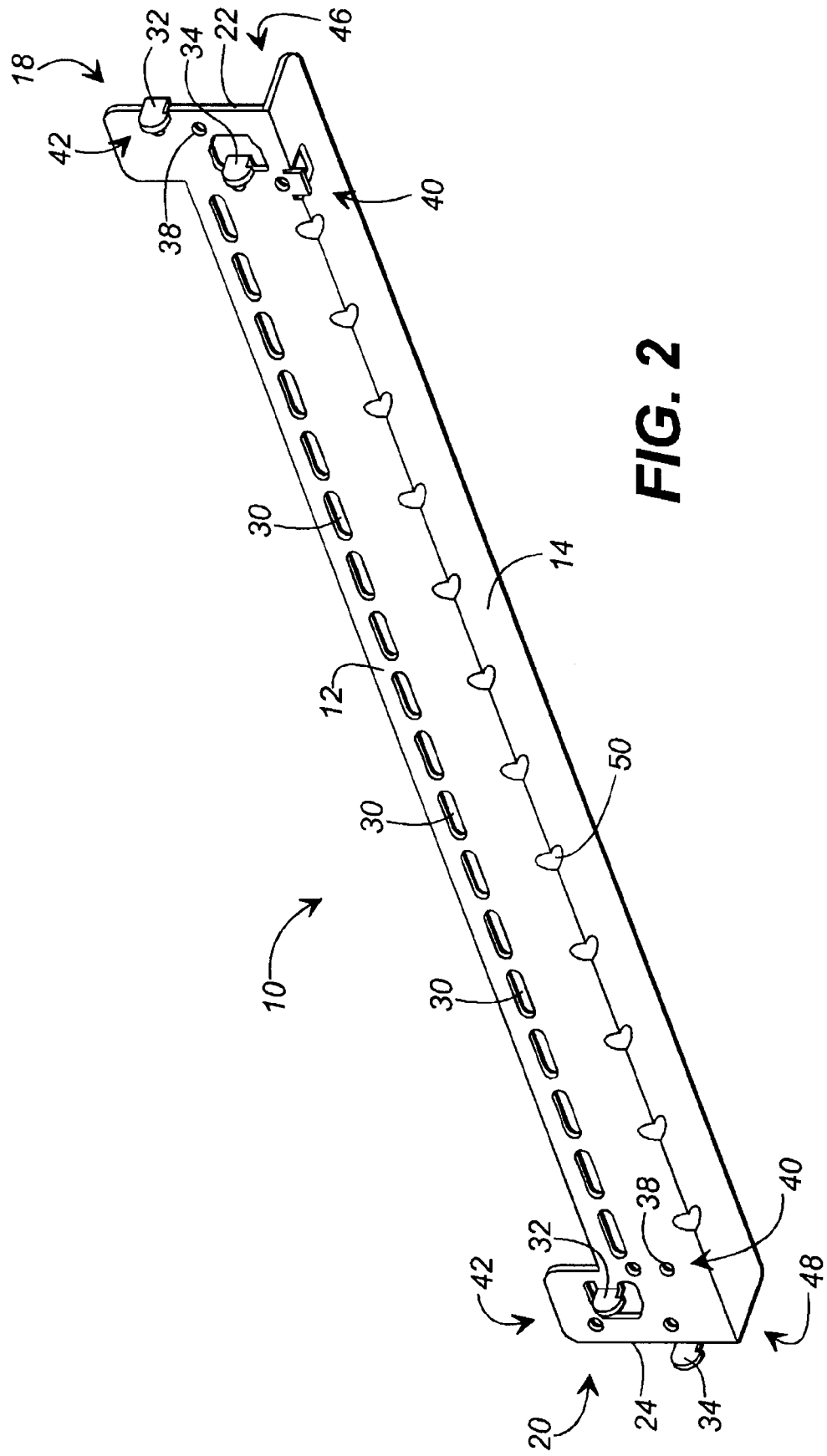
FIG. 2 is a lower rear perspective view of the support rail shown in FIG. 1.
Figure 3:
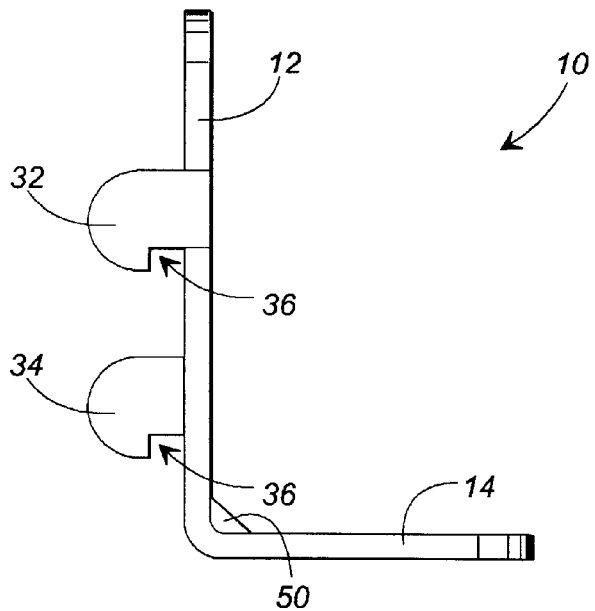
FIG. 3 is an end view of the support rail shown in FIGS. 1–2.

Referring now in more detail to the drawings, in which like reference numerals indicate corresponding parts throughout the several views, FIGS. 1–3 illustrate a support rail 10 constructed in accordance with the present invention. The support rail 10 comprises an elongated side portion 12 that is connected to an elongated base portion 14. Normally, the support rail 10 is unitarily constructed out of a rigid material such as a suitable metal such that the side portion 12 and base portion 14 are formed out of a single piece of material. Particularly preferred for construction of the support rail 10 is heat-treated, cold rolled steel.

As indicated most clearly in FIGS. 1 and 2, the side portion 12 is substantially planar and rectilinear in shape and comprises a top edge 16 and first and second ends 18 and 20 which form first and second outer edges 22 and 24. Formed at the first and second ends 18 and 20 are first and second vertical extensions 26 and 28, respectively, that extend vertically upward from the top edge 16 of the support rail 10. Provided adjacent the top edge 16 is a plurality of clamp mounting openings 30, the purpose of which is described below. Typically, each of the clamp mounting openings 30 is elongated and extends in the longitudinal direction of the support rail 10 such that the top and bottom edges of the openings 30 are substantially parallel to the top edge 16 of the support rail.

Provided at each end 18 and 20 of the side portion 12 of the support rail 10 are upper and lower alignment tabs 32 and 34. Each upper and lower alignment tab 32 and 34 extends rearwardly from the side portion 12 and is adapted to be received by alignment holes of an enclosure rack. Typically, each alignment tab 32, 34 includes a lower notch 36 (FIG. 3) that is adapted to fit about the edge of an alignment hole of the enclosure rack to secure the rail 10 to the rack. The upper alignment tab 32 at each end 18 and 20 of the side portion 12 normally is vertically spaced 0.5 EIA-U above the lower alignment tab 34. Because of this spacing, the upper alignment tabs 32 are positioned in the first and second vertical extensions 26 and 28. Although the upper and lower tabs 32 and 34 are described as being vertically spaced by 0.5 EIA-U, it is to be understood that alternative fractional spacing could be used to fit the particular requirements of the application in which the rail will be used.

For purposes which are explained below, the upper alignment tab 32 of the first end 18 extends from the first outer edge 22 and the lower alignment tab 34 of the first end 18 extends from a point laterally spaced a predetermined distance inward from the first outer edge 22. At the second end 20 of the support rail 10, it is the lower alignment tab 34 which extends from the second outer edge 24 and the upper alignment tab 32 which extends from a point laterally spaced a predetermined distance inward from the second outer edge 24. Accordingly, the alignment tabs 32, 34 are arranged in a laterally staggered configuration. Arranged in this manner, the upper alignment tabs 32 are spaced apart from each other a distance equal to the distance separating the pair of lower alignment tabs 34. This spacing allows for mounting with either the upper or lower alignment tabs in conventional enclosure rack systems.

Formed adjacent each of the tabs 32 and 34 are mounting holes 38. Normally, the mounting holes 38 are arranged in inner and outer pairs 40 and 42 at both ends 18, 20 of the side portion 12 of the support rail 10. As indicated in FIGS. 1 and 2, the inner pair 40 of mounting holes is positioned at a relatively lower position in relation to the outer pair 42 of mounting holes. As is explained in greater detail below, the mounting holes 38 are used to pass mounting fasteners through the support rail 10 and into the enclosure rack to fixedly secure the support rail to the rack.

Similar to the side portion 12, the base portion 14 of the support rail 10 is substantially planar and rectilinear in shape. Normally, the base portion has an outer edge 44 and first and second ends 46 and 48. As shown in FIG. 3, the base portion 14 extends inwardly from the side portion 12 at an angle of approximately 90 degrees such that, when viewed from its end, the support rail 10 is substantially L-shaped. Usually positioned at the juncture between the side portion 12 and the base portion 14 is a plurality of angle supports 50 which add strength to the support rail. These angle supports 50 typically comprise indentations formed during the manufacturing process.

Figure 7:
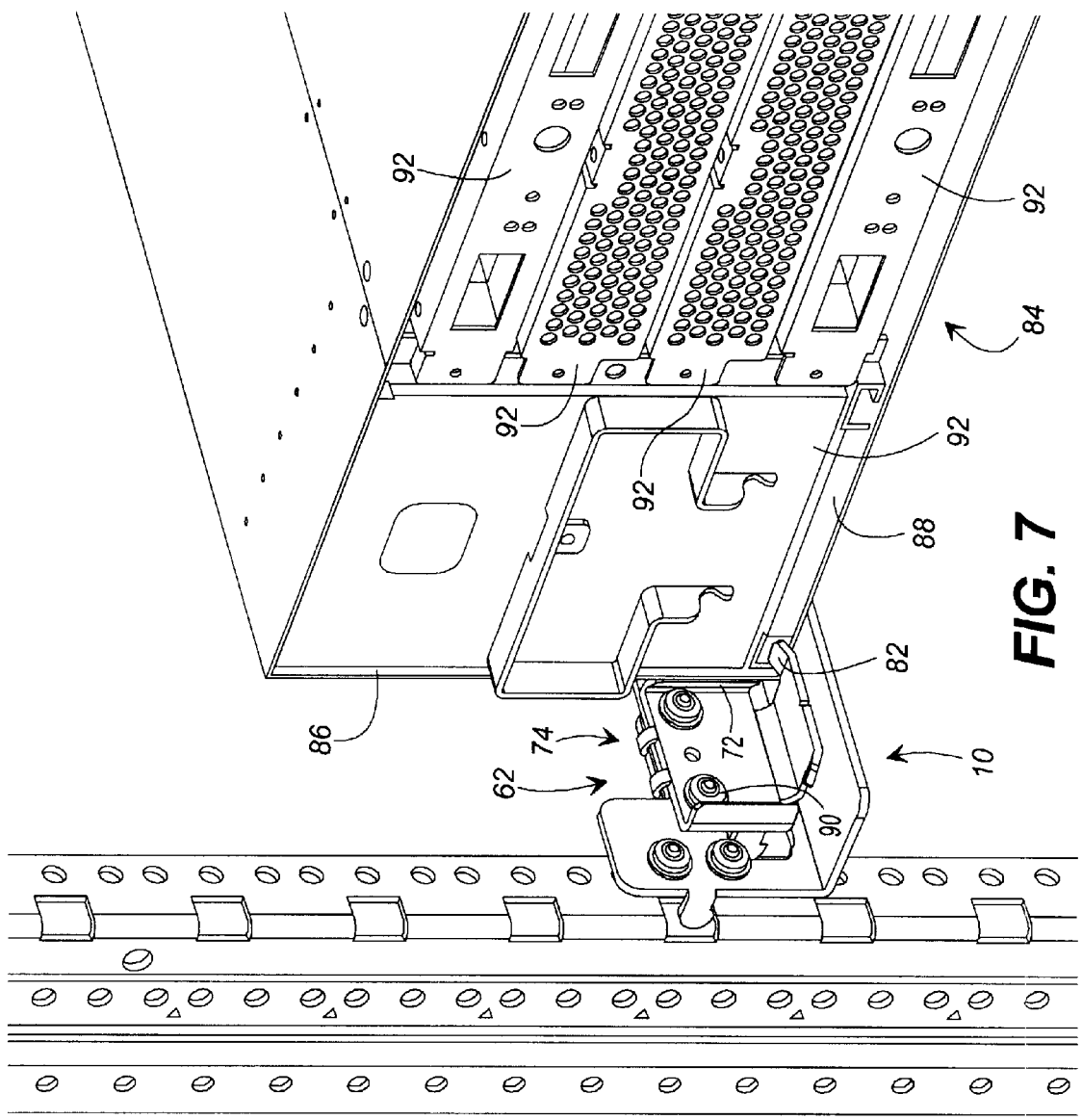
FIG. 7 is an upper front perspective view depicting mounting of the tie-down clamp shown in FIGS. 5–6 to the support rail shown in FIGS. 1–4.

The general structure of the support rail 10 having been described above, mounting of the rail to a rack will now be discussed with reference to FIG. 4. As indicated in this figure, the support rail 10 described above can be mounted to an enclosure rack column 52 in either a whole EIA-U position or a half EIA-U position. The lower support rail 54 shown in the figure is oriented to mount in the whole EIA-U position. To effect this mounting, the lower alignment tab 34 is inserted into one of the alignment holes 56 of the rack column 52 such that the lower notch 36 of the tab rests about the lower edge of the alignment hole. Simultaneously, the lower alignment tab 34 of the other end of the rail is similarly inserted into an appropriate alignment hole of another rack column (not shown). The notches prevent the tabs from slipping out of the rack mounting holes during installation. When the lower alignment tabs 34 are inserted into the alignment holes as described above, the outer pair 42 of mounting holes 38 depicted in the figure align with the mounting holes 58 of the rack column 52. At the other end of the rail the inner pair 40 of the mounting holes align with mounting holes provided in the other rack column (not shown). Once the rail 54 is so aligned, it can be fixedly secured to the rack with conventional fasteners such as screws or bolts (FIG. 7).

Figure 4:
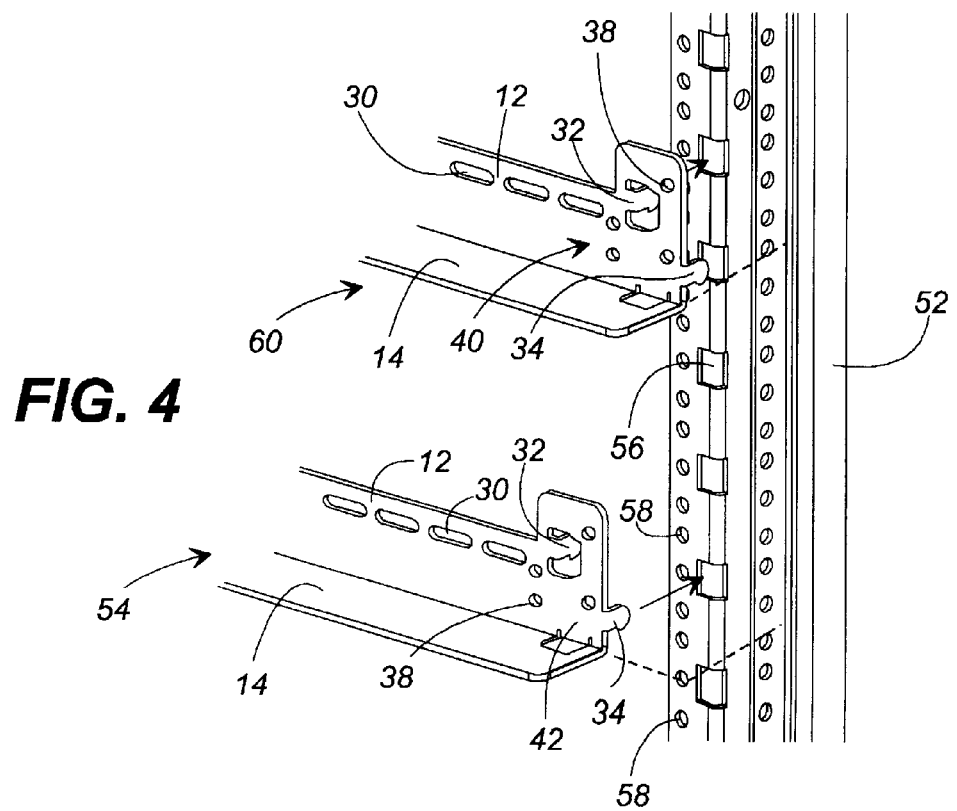
FIG. 4 is an upper-front view of two support rails similar to that shown in FIGS. 1–3.

The upper support rail 60 shown in FIG. 4 is oriented to mount in the half EIA-U position. This mounting is effected by inserting the upper alignment tabs 32 of the rail into appropriate alignment holes 56 of the rack columns 52 such that the inner pair 40 of the mounting holes 38 shown in the figure align with the mounting holes 58 of the rack column 52, and the outer pair 42 of mounting holes 38 align with the mounting holes of the other rack column (not shown). Similar to the lower support rail 54, the upper support rail 60 is then fixedly secured to the rack with conventional fasteners.

When installation is conducted in this manner, the support rails are slightly staggered fore and aft of each other. Due to the orientation and dimensions of the rails, however, this staggering does not interfere with the enclosure structure or with the equipment mounted therein. Moreover, once all of the equipment components are installed within the enclosure, the staggering of the support rails is not visible to the observer.

Figure 8:
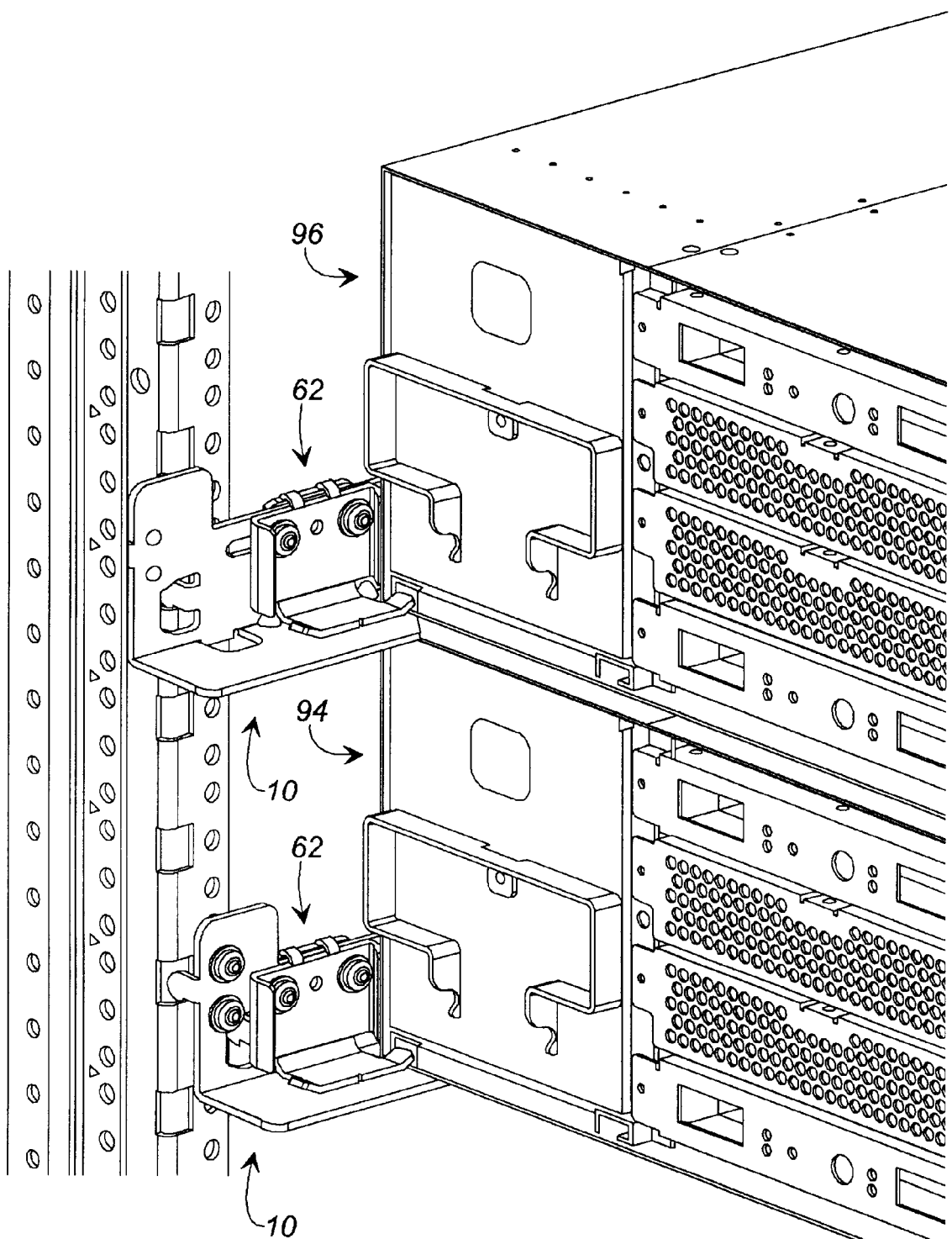
FIG. 8 is an upper front perspective view depicting mounting of two equipment components in whole and fractional EIA-U positions.

As can be appreciated from the above, the capability of the support rail of the present invention to be mounted at both whole and half EIA-U positions allows the entire space within the enclosure to be utilized, thereby maximizing equipment storage density (see FIG. 8). The design of the support rails further allows for simple and quick installation without the need for use of multiple types of support rails and without the need for height adjustment of the alignment tabs.

Figure 5:
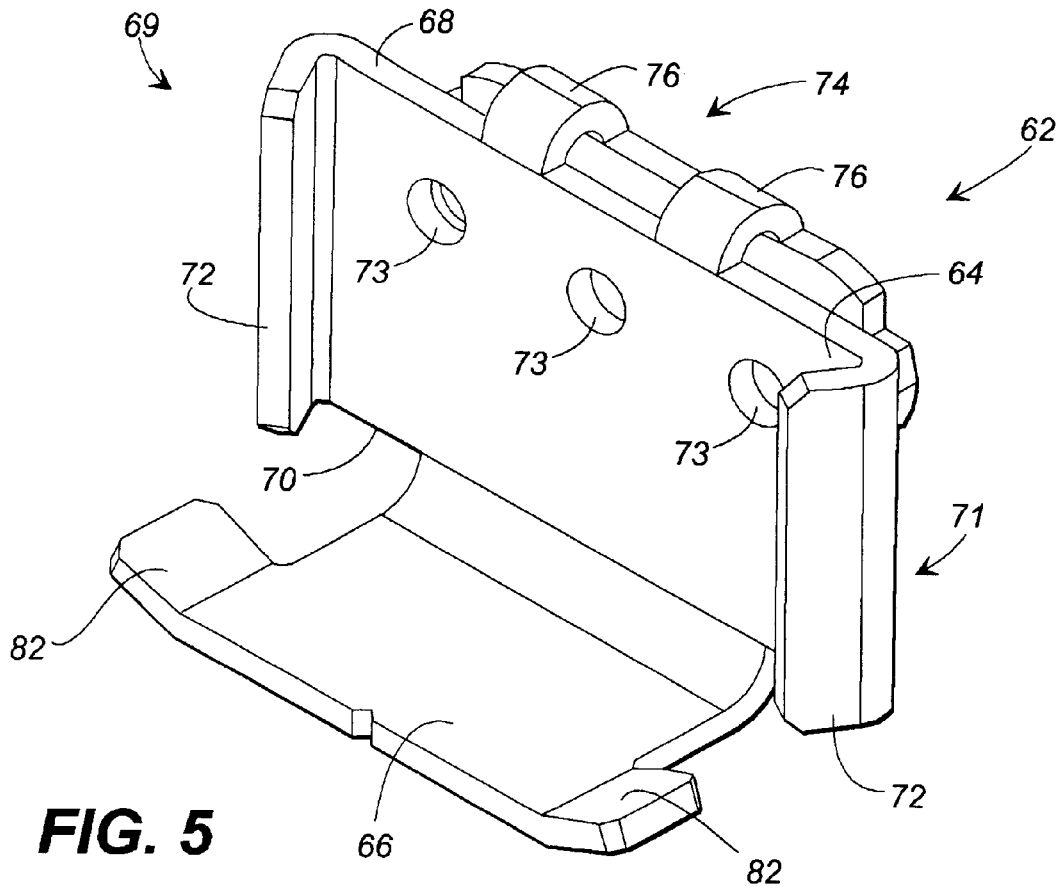
FIG. 5 is an upper front perspective view of a tie-down clamp constructed in accordance with the present invention.
Figure 6:
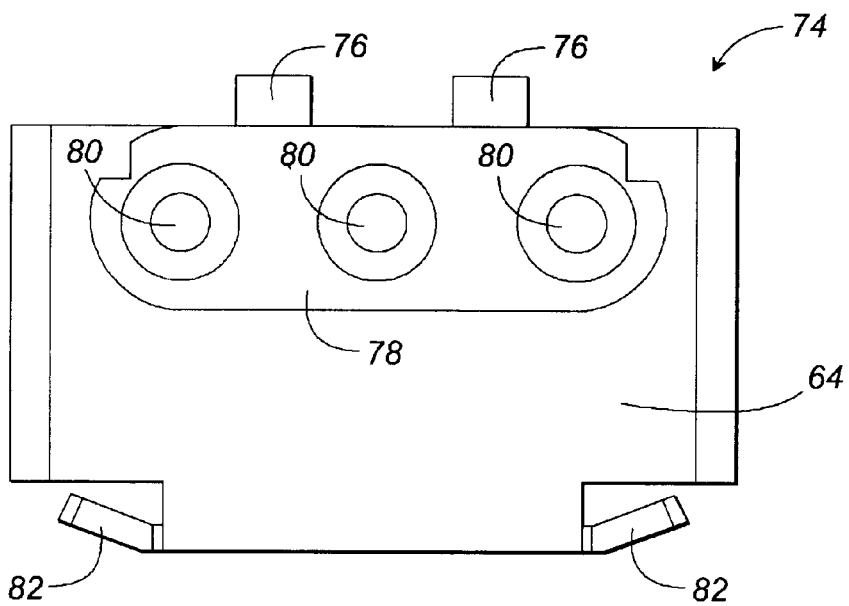
FIG. 6 is a rear view of the tie-down clamp shown in FIG. 5.

Illustrated in FIGS. 5–6 is a low profile tie-down clamp 62 that forms part of the equipment enclosure rack support rail system of the present invention. As shown in these figures, the clamp 62 generally comprises a side portion 64 and a base portion 66. Preferably, the clamp 62 is formed unitarily out of a substantially rigid material such as a suitable metal. Most preferably, the clamp 62 is composed of heat-treated, cold rolled steel. The side portion 64 is substantially planar and rectilinear in shape and comprises a top edge 68, a bottom edge 70, first and second ends 69 and 71, and a plurality of mounting holes 73. A pair of end flanges 72 extend inwardly from the ends 69 and 71 of the side portion 64. Extending from the top edge 68 of the side portion is mounting hinge 74. The mounting hinge 74 comprises one or more arcuate portions 76 and a planar portion 78. As indicated in the figures, each arcuate portion 76 is arranged such that the mounting hinge 74 is curved backwardly towards the side portion 64 such that the planar portion 78 is substantially parallel to the side portion. The planar portion 78 is provided with a plurality of mounting holes 80 which are aligned with the mounting holes 73 provided in the side portion. Typically, each mounting hole 80 comprises a self-clinching threaded nut such that a standard screw or bolt can be used to secure the clamp in place in the system.

The base portion 66 of the tie-down clamp 62 extends downwardly from the side portion 64 and is substantially planar in shape. Typically, the base portion 66 is oriented in a plane substantially perpendicular to that of the side portion 64. Extending outwardly and upwardly from the base portion are opposed feet 82. As is discussed below, these feet 82, together with the end flanges 72, anchor the equipment component positioned atop the support rail 10 in the enclosure.

When the equipment enclosure is to be shipped with equipment mounted therein, a tie-down clamp 62 is mounted to each rail 10 supporting each component. As indicated in FIG. 7, the tie-down clamp is placed atop the support rail 10 with its mounting hinge 74 overlapping the top edge 16 of the side portion 12 of the support rail. This overlapping arrangement limits the extent to which the clamp 62 extends into the enclosure to maximize the horizontal equipment envelope therein. When so positioned on the rail 10, the clamp 62 can be slid along the length of the rail 10 until it abuts the rear of the equipment component 84 supported by the rail 10 with one of the end flanges 72 abutting a side flange 86 of the component and one of the feet 82 overlapping a bottom flange 88 of the component. When the clamp 62 is placed in abutment with the component 84, the clamp 62 can be fixedly secured to the rail 10 by passing conventional fasteners 90 such as screws or bolts through the mounting holes of the side portion 64 of the clamp 62, the elongated mounting openings 30 of the side portion 12 of the rail and the mounting holes 80 of the planar portion 78 of the hinge 74. Typically, the equipment component 84 comprises a data storage component such as a disk drive enclosure. Irrespective of the type of component supported by the rail 10, the component 84 normally includes a plurality of removable modules 92 that are designed to be removable from the rear of the component with the component online so that malfunctioning modules can be quickly replaced without shutting the system down.

When the fasteners 90 are tightened, the mounting hinge 74 flexes inwardly toward the side portion 12 of the rail 10 until contact is made between the planar portion 78 of the hinge 74 and the side portion 12 of the rail 10. Once the fasteners 90 have been fully tightened, the tie-down clamp 62 is tightly secured to the rail 10 by friction such that it cannot travel along the rail 10 and therefore will prevent the equipment component from traveling rearwardly or upwardly in relation to the support rail 10.

As is apparent from FIG. 7, the intrusion of the tie-down clamp 62 into the rack horizontal equipment envelope is minimized because of the low profile design of the clamp. Therefore, the equipment components 84 are provided with enough clearance such that each of the individual modules 92 of the components can be quickly removed from the rear of the enclosure and replaced without the need for removing the entire equipment component from the front of the enclosure. Since the remainder of the component can be left operating in the enclosure during removal and replacement of the inoperative or malfunctioning module, system downtime is greatly reduced.

Figure 9:
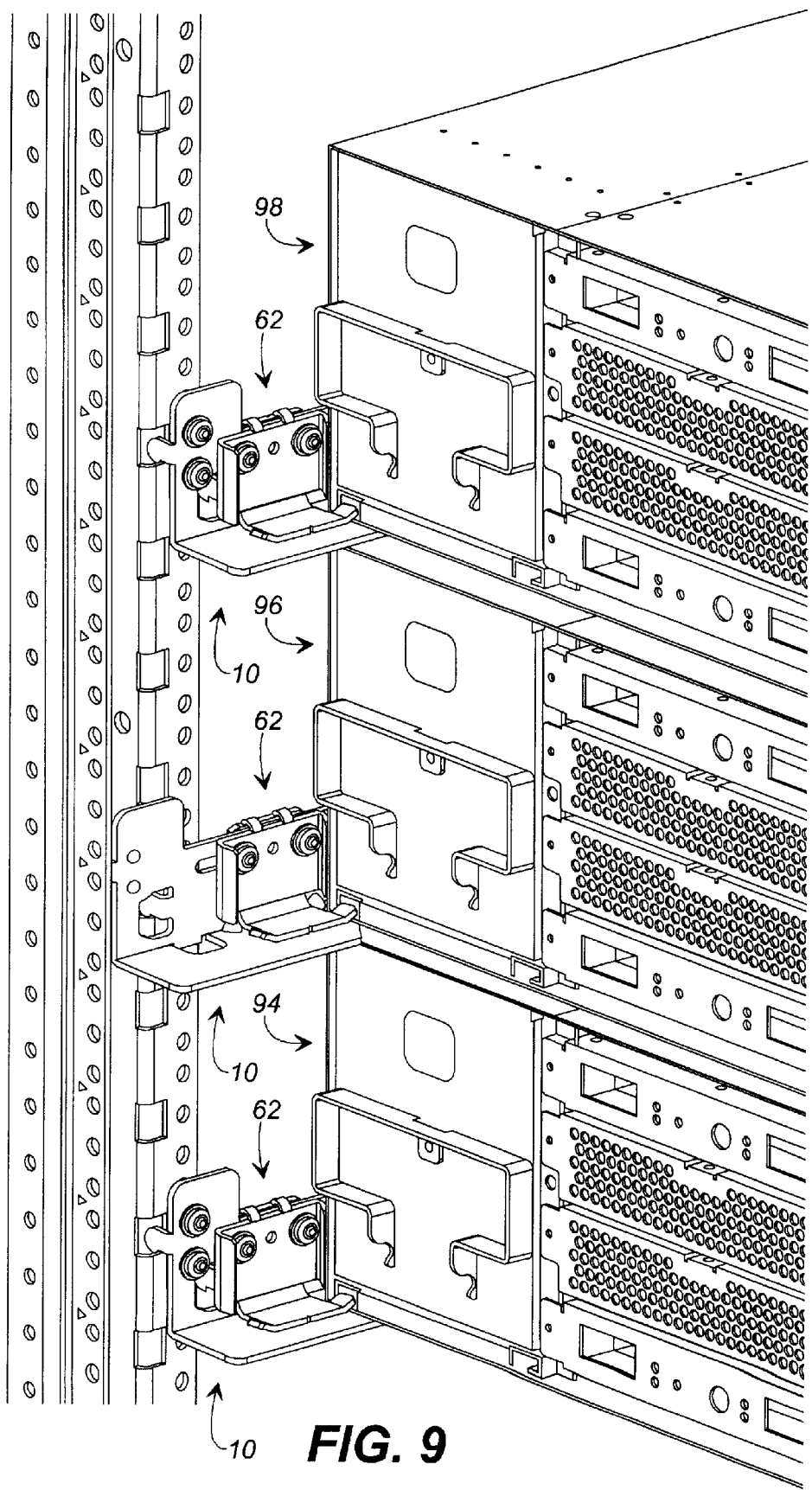
FIG. 9 is an upper front perspective view depicting mounting of three equipment components in whole and fractional EIA-U positions.

As noted above, the support rail system of the present invention can be used to mount equipment components in very close proximity with each other. FIGS. 8 and 9 show several support rails 10 used in conjunction with several tie-down clamps 62 to support and secure two and three equipment components 84, respectively. Each of these three components 84 has a fractional height dimension such as, by way of example, 3.5 EIA-U. As indicated in FIGS. 8 and 9, the first component 94 is shown supported in a whole EIA-U position. Due to the fractional EIA-U height of this component 94, the second component 96 can be mounted in a half EIA-U position as shown in FIGS. 8 and 9 to maximize packing density within the enclosure. When the second component 96 is mounted immediately above the first component 94, a third component 98 can be mounted in the whole EIA-U position shown in FIG. 9 immediately above the second component. Mounting of the components within the enclosure rack can be continued in this manner such that nearly all of the little vertical space within the enclosure is utilized.

While preferred embodiments of the invention have been disclosed in detail in the foregoing description and drawings, it will be understood by those skilled in the art that variations and modifications thereof can be made without departing from the spirit and scope of the invention as set forth in the following claims. In particular, as mentioned above, although the alignment tabs of the rail system described above are described as being spaced by a half EIA-U, it will be appreciated by those having ordinary skill in the art that alternative fractional EIA-U spacing falls within the purview of the present invention.

Therefore, the following is claimed:

1. A rack support rail system for use in an equipment enclosure including a rack to which equipment components are to be mounted, said rail system comprising:
   an elongated support rail including an elongated side portion adapted to mount directly to the rack and an elongated base portion adapted to directly support an equipment component, said side portion being substantially planar and having a top edge, first and second ends which form first and second outer edges, and a plurality of mounting holes provided therein, said base portion being substantially planar and having an outer edge and first and second ends;
   a tie-down clamp securely mountable to said support rail to secure the equipment component supported by said support rail, said tie-down clamp being configured to have a low profile so as not to intrude substantially into the horizontal equipment envelope within the equipment enclosure such that individual equipment component modules can be removed from the equipment component without the need to remove the entire equipment component; and
   alignment means for aligning said elongated support rail with the enclosure rack in incremental positions so that equipment storage density can be maximized within the enclosure.

2. The system of claim 1, wherein said alignment means comprises a pair of upper alignment tabs and a pair of lower alignment tabs, said alignment tabs extending rearwardly from said side portion of said support rail.

3. The system of claim 2, wherein one upper alignment tab and one lower alignment tab are positioned at each end of said support rail, each upper alignment tab being vertically spaced a fraction of an EIA-U above its adjacent lower alignment tab.

4. The system of claim 3, wherein said upper alignment tab positioned at said first end and said lower alignment tab positioned at said second end are formed at said first and second outer edges of said side portion, respectively, and said lower alignment tab positioned at said first end and said upper alignment tab positioned at said second end are laterally spaced inward from said first and second outer edges of said side portion, respectively.

5. The system of claim 4, wherein said lower alignment tabs align with alignment holes of the rack when said rail is aligned in a whole EIA-U position, and said upper alignment tabs align with alignment holes of the rack when said rail is aligned in a fractional EIA-U position.

6. The system of claim 5, wherein said mounting holes are arranged such that inner and outer pairs of mounting holes are positioned at each end of said side portion of said support rail, said inner pair of mounting holes positioned at said first end and said outer pair of mounting holes positioned at said second end being aligned with mounting holes of the rack when said support rail is aligned in a whole EIA-U position, and said outer pair of mounting holes positioned at said first end and said inner pair of mounting holes positioned at said second end being aligned with mounting holes of the rack when said support rail is aligned in a fractional EIA-U position.

7. The system of claim 1, wherein said side portion of said support rail further includes a plurality of clamp mounting openings positioned adjacent said top edge of said side portion and said tie-down clamp includes mounting holes, said clamp mounting openings of said rail and said mounting holes of said clamp facilitating secure mounting of said clamp to said rail.

8. The system of claim 1, wherein said tie-down clamp further includes a mounting hinge which overlaps said top edge of said side portion of said support rail when said clamp is mounted to said rail.

9. The system of claim 1, wherein said tie-down clamp further includes at least one end flange adapted to abut a side flange of the equipment component supported by said support rail and at least one foot adapted to overlap a bottom flange of the equipment component.

10. A rack support rail for use in an equipment enclosure including a rack to which equipment components are to be mounted, said rail comprising:
    an elongated side portion adapted to mount directly to the rack, said side portion being substantially planar and having a top edge, first and second ends which form first and second outer edges, and a plurality of mounting holes provided therein, said side portion further having a pair of upper alignment tabs and a pair of lower alignment tabs which extend rearwardly from said side portion of said support rail, one of said pairs of alignment tabs being adapted to align said support rail in a whole EIA-U position within the enclosure and one of said pairs of alignment tabs being adapted to align said support rail in a fractional EIA-U position within the enclosure; and
    an elongated base portion adapted to directly support an equipment component, said base portion being substantially planar and having an outer edge and first and second ends.

11. The rack support rail of claim 10, wherein one upper alignment tab and one lower alignment tab are positioned at each end of said support rail, each upper alignment tab being vertically spaced a fraction of an EIA-U above its adjacent lower alignment tab.

12. The rack support rail of claim 11, wherein said upper alignment tab positioned at said first end and said lower alignment tab positioned at said second end are formed at said first and second outer edges of said side portion, respectively, and said lower alignment tab positioned at said first end and said upper alignment tab positioned at said second end are laterally spaced inward from said first and second outer edges of said side portion, respectively.

13. The rack support rail of claim 12, wherein said lower alignment tabs align with alignment holes of the rack when said rail is aligned in a whole EIA-U position, and said upper alignment tabs align with alignment holes of the rack when said rail is aligned in a fractional EIA-U position.

14. The rack support rail of claim 13, wherein said mounting holes are arranged such that inner and outer pairs of mounting holes are positioned at each end of said side portion of said support rail, said inner pair of mounting holes positioned at said first end and said outer pair of mounting holes positioned at said second end being aligned with mounting holes of the rack when said support rail is aligned in a whole EIA-U position, and said outer pair of mounting holes positioned at said first end and said inner pair of mounting holes positioned at said second end being aligned with mounting holes of the rack when said support rail is aligned in a fractional EIA-U position.

15. A low profile tie-down clamp for use in an equipment enclosure rack support rail system, said tie-down clamp comprising:

- a side portion, said side portion being substantially planar and having a top edge, a bottom edge, first and second ends, and a plurality of mounting holes used to mount said tie-down clamp to a support rail of the system;
- at least one end flange extending inwardly from one of said ends of said side portion;
- a mounting hinge that extending upwardly from said top edge of said side portion which is adapted to overlap a top edge of the support rail when said tie-down clamp is mounted thereto;
- a base portion that is connected to said side portion, said base portion being substantially planar and oriented in a plane substantially perpendicular to that of said side portion; and
- at least one foot that extends outwardly and upwardly from said planar portion;
- wherein said at least one end flange and said at least one foot abut an equipment component supported by the support rail when said tie-down clamp is mounted to the rail to securely anchor the equipment component thereto.

16. The tie-down clamp of claim 15, wherein said mounting hinge has an arcuate portion that is curved backwardly towards said side portion and a planar portion connected to said arcuate portion that is substantially parallel to the said side portion, said planar portion comprising a plurality of mounting holes that are aligned with the mounting holes of said side portion.

* * * * *